(12) United States Patent
Yu

(10) Patent No.: US 8,822,294 B2
(45) Date of Patent: Sep. 2, 2014

(54) METHOD FOR IMPROVING WRITE MARGINS OF SRAM CELLS

(71) Applicant: Shanghai Huali Microelectronics Corporation, Shanghai (CN)

(72) Inventor: Liujiang Yu, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 50 days.

(21) Appl. No.: 13/721,071

(22) Filed: Dec. 20, 2012

(65) Prior Publication Data

US 2013/0260542 A1 Oct. 3, 2013

(30) Foreign Application Priority Data

Mar. 31, 2012 (CN) .......................... 2012 1 0093940

(51) Int. Cl.
*H01L 21/00* (2006.01)
*H01L 27/11* (2006.01)
*H01L 21/28* (2006.01)
*H01L 27/02* (2006.01)

(52) U.S. Cl.
CPC ............ *H01L 21/28* (2013.01); *H01L 27/1104* (2013.01); *H01L 27/0207* (2013.01)
USPC ............................................. 438/291; 438/238

(58) Field of Classification Search
USPC .................................. 438/238–240, 289–291
See application file for complete search history.

(56) References Cited

U.S. PATENT DOCUMENTS 5,126,279 A * 6/1992 Roberts ........................ 438/210
5,426,065 A * 6/1995 Chan et al. .................... 438/238
5,605,853 A * 2/1997 Yoo et al. ...................... 438/238

* cited by examiner

*Primary Examiner* — Richard Booth
(74) *Attorney, Agent, or Firm* — Anova Law Group, PLLC

(57) ABSTRACT

The present invention provides a method for improving the write margins of the SRAM cells. The method comprises: before etching a polysilicon layer to form the polysilicon gates, performing a pre-implantation process to the polysilicon layer; wherein the polysilicon layer defines SRAM NMOSFETs regions and SRAM PMOSFETs regions; wherein the pre-implantation process comprises pre-implanting the fifth-group elements to the SRAM NMOSFETs regions and the NMOSFETs regions except to the SRAM NMOSFETs regions in the polysilicon layer, and pre-implanting the third-group elements to the PMOSFETs regions excluding the SRAM PMOSFETs regions in the polysilicon layer; wherein the process of pre-implanting the third-group elements comprises forming a pre-implantation photo mask capable of covering the SRAM PMOSFETs regions and using the pre-implantation photo mask to pre-implanting the third-group elements.

10 Claims, 2 Drawing Sheets

METHOD FOR IMPROVING WRITE MARGINS OF SRAM CELLS

CROSS-REFERENCE TO RELATED APPLICATION

This application claims the priority benefit of China application serial no. 201210093940.0, filed Mar. 31, 2012. All disclosure of the China application is incorporated herein by reference.

FIELD OF THE INVENTION

The present invention relates to the field of semiconductor fabrication technology and particularly to a method for improving the write margins of the SRAM cells and a method for manufacturing the SRAM cells with enhanced write margins.

BACKGROUND OF THE INVENTION

The SRAM (static random access memory) is an important semiconductor memory and is widely used in the high-speed data exchange systems such as the computers, communications, multimedia, etc. FIG. 1 illustrates a layout structure of a SRAM cell less than 90 nm. As shown in FIG. 1, the layout structure of a SRAM cell comprises three portions including the active areas, the polysilicon gates and the contact holes. Wherein the numeral 1 represents a Pass Gate, which is an NMOSFET; the numeral 2 represents a Pull Down MOS, which is also an NMOSFET; and the numeral 3 represents a Pull Up MOS, which is a PMOSFET.

The write margin is an important parameter to measure the write performance of the SRAM cells. FIG. 2 is a circuit diagram of a SRAM cell. As illustrated in FIG. 2, the numeral 4 represents a Pass Gate, the numeral 5 represents a Pull Down MOS and the numeral 6 represents a Pull Up MOS. The data stored in the node 7 is assumed to be a low-potential (i.e. the storage data is "0") and the data stored in the node 8 is assumed to be a high-potential (i.e. the storage data is "1"). An example of writing a high potential to the node 7 and a low potential to the node 8 will be described as follow. Before the write operation, the bit line 9 will be pre-charged to a high potential, and the bit line 10 will be pre-charged to a low potential. At the beginning of the write operation, the word line 11 is turned on. Since the initial data stored in the node 7 is a low potential, the Pull Up MOS 6 is turned on while the Pull Down MOSFET 5 is turned off in the initial state. Therefore, the potential of the node 8 will changes to an intermediate potential instead of "1" as the Pull Up MOS 6 and the Pass Gate 4 are both turned on, wherein the intermediate potential is determined by the equivalent resistances of the Pass Gate 4 and the Pull Up MOS 6. In order to achieve the write operation, the intermediate potential of the node 8 should be less than a certain value, that is, the ratio of the equivalent resistances of the Pass Gate 4 and the Pull Up MOS 6 should be less than a certain value. The lower the intermediate potential is, the greater the write margins of the SRAM cells is. If the equivalent resistance of the Pull Up MOS 6 increases, the intermediate potential of the node 8 will be reduced, thereby increasing the write margins of the SRAM cells.

According to the related advanced process (such as less than 45 nm process), the pre-implantation process for the polysilicon gate will be applied. Before the etching process to the polysilicon layer for forming the polysilicon gate, the fifth-group elements are pre-implanted to the polysilicon layer before forming the NMOSFET gates and the third group elements are pre-implanted to the polysilicon layer before forming the PMOSFET gate, so as to reduce the gate resistance and the depletion effects of the polysilicon gate, and further to achieve the purpose of adjusting the threshold voltage (Vt) and the open current (Ion) of the CMOS device. In the manufacturing process for the SRAM cells, the process of pre-implanting the fifth-group elements is performed to the two NMOSFETS including the Pass Gate 1 and the Pull Down MOS 2 in FIG. 1; and the process of pre-implanting the third-group elements is performed to the Pull Up MOS (PMOS device) which is the Pull Up MOS 3 in FIG. 1.

However, the write margin of the SRAM cell which is manufactured by the conventional SRAM fabrication method is not satisfying. Thus, it is necessary to provide an effective method to enhance the write margins of the SRAM cells.

SUMMARY OF THE INVENTION

Accordingly, at least one object of the present invention is to provide a method to enhance the write margins of the SRAM cells effectively, and a method for manufacturing the SRAM cells with enhanced write margins.

According to the first aspect of the present invention, there is provided a method for improving the write margins of the SRAM cells comprising: before etching a polysilicon layer to form the polysilicon gates, performing a pre-implantation process to the polysilicon layer; wherein the polysilicon layer defines SRAM NMOSFETs regions and SRAM PMOSFETs regions; the pre-implantation process comprises pre-implanting the fifth-group elements to the SRAM NMOSFETs regions and the NMOSFETs regions except to the SRAM NMOSFETs regions in the polysilicon layer, and pre-implanting the third-group elements to the PMOSFETs regions excluding the SRAM PMOSFETs regions in the polysilicon layer; wherein the process of pre-implanting the third-group elements comprises forming a pre-implantation photo mask capable of covering the SRAM PMOSFETs regions and using the pre-implantation photo mask to pre-implanting the third-group elements.

According to the concept of the present invention, wherein the pre-implantation photo mask capable of covering the SRAM PMOSFETs regions is formed through the logic operation.

According to the concept of the present invention, wherein the SRAM NMOSFETs regions are Pass Gate regions and Pull Down MOS regions; the SRAM PMOSFETs regions are Pull Up MOS regions.

According to the concept of the present invention, wherein the pre-implantation photo mask comprises: a first mask area covering the Pass Gate regions, a second mask area covering the Pull Down MOS regions, and a third mask area covering the Pull Up MOS regions.

According to the concept of the present invention, wherein the SRAM cell is manufactured by using 45 nm technology.

According to the second aspect of the present invention, a method for manufacturing SRAM cells with enhanced write margins is provided. The method comprises: depositing a polysilicon layer in which SRAM NMOSFETs regions and SRAM PMOSFETs regions are defined; Pre-implanting the fifth-group elements to the SRAM NMOSFETs regions as well as the other NMOSFETs regions in the polysilicon layer except to the SRAM NMOSFETs regions; Pre-implanting the third-group elements to the other PMOSFETs regions excluding the SRAM PMOSFETs regions in the polysilicon layer by using a pre-implantation photo mask covering the SRAM PMOSFETs regions.

In the present invention, the process of pre-implanting the Pull Up MOS regions of the SRAM is removed by using a designed pre-implantation photo mask, and thus the doping concentration of the polysilicon gate of the Pull Up MOS is reduced, the equivalent resistance of the Pull Up MOS is increased, and the write margin of the SRAM cell is improved.

BRIEF DESCRIPTION OF THE DRAWINGS

The accompanying drawings are included to provide a further understanding of the advantages and principles of the invention, in which.

DETAILED DESCRIPTION OF THE EMBODIMENTS

Figure 1:
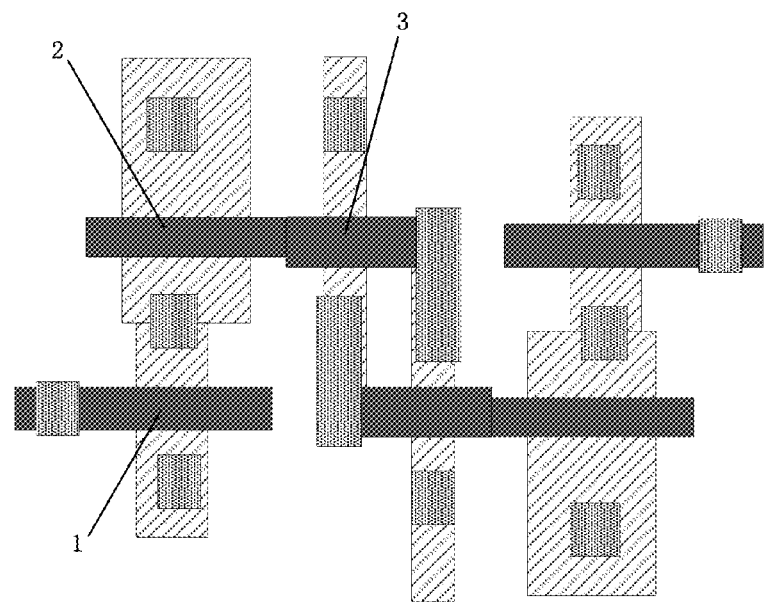
FIG. 1 is a schematic diagram of the layout of a SRAM cell.

Reference will now be made in detail to the present preferred embodiments and the accompanying figures of the invention in order to provide a further understanding of the invention. The figures are not drawn to scale and they are provided merely to illustrate the invention instead of limiting the scope of the present invention, like reference numerals are used throughout the figures to designate similar or equivalent element.

Figure 3:
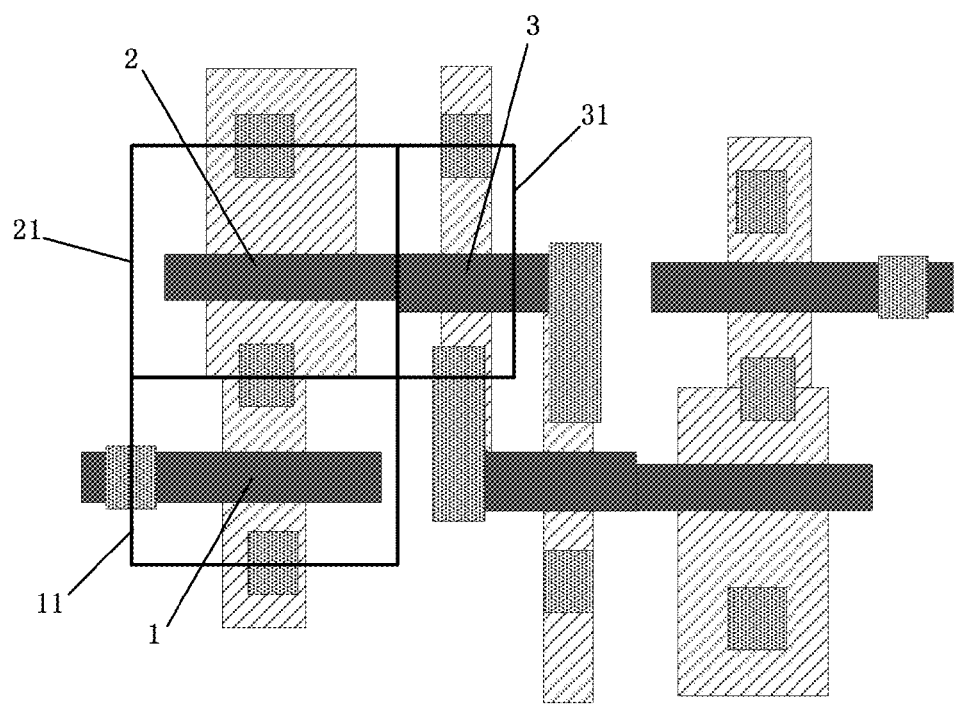
FIG. 3 is a schematic diagram of the layout of the SRAM cell with enhanced write margins in an embodiment of the present invention.

FIG. 3 is a schematic diagram of the layout of the SRAM cell with enhanced write margins in an embodiment of the present invention.

In an embodiment, the method for improving the write margins of the SRAM cells comprises: before etching a polysilicon layer to form the polysilicon gates, performing a pre-implantation process to the polysilicon layer, wherein the polysilicon layer defines SRAM NMOSFETs regions and SRAM PMOSFETs regions. The polysilicon gates can be the polysilicon gates of different semiconductor devices. The pre-implantation process comprises pre-implanting the fifth-group elements to the SRAM NMOSFETs regions as well as the NMOSFETs regions except to the SRAM NMOSFETs regions in the polysilicon layer, and pre-implanting the third-group elements to the PMOSFETs regions excluding the SRAM PMOSFETs regions in the polysilicon layer. In the embodiment, as shown in FIG. 3, the SRAM NMOSFETs region includes the Pass Gate region 1 and the Pull Down MOS region 2. The SRAM PMOSFETs region is the Pull Up MOS region 3.

Furthermore, a pre-implantation photo mask capable of covering the Pull Up MOS regions 3 is utilized for the process of pre-implanting third-group elements so that the Pull Up MOS regions 3 in the SRAM will not be pre-implanted. The pre-implantation photo mask can be formed through the logic operation.

Specifically, as shown in FIG. 3, the pre-implantation photo mask comprises a first mask area 11 covering the Pass Gate region 1, a second mask area 21 covering the Pull Down MOS region 2, and a third mask area 31 covering the Pull Up MOS region 3 in a SRAM cell.

Therefore, during the pre-implantation process to the polysilicon layer, the Pull Up MOS regions of the SRAM cells will not be pre-implanted, which reduces the doping concentration of polysilicon gate of the Pull Up MOS and increases the parasitic resistances and the depletion effects of the polysilicon gates of the Pull Up MOS, thus results in the increase of the threshold voltage of the Pull Up MOS and the decrease of the open current. Therefore, the equivalent resistance of the Pull Up MOS can be increased, and the potential of the node 8 can be reduced during the write operation so as to improve the write margins of the SRAM cells.

Figure 2:
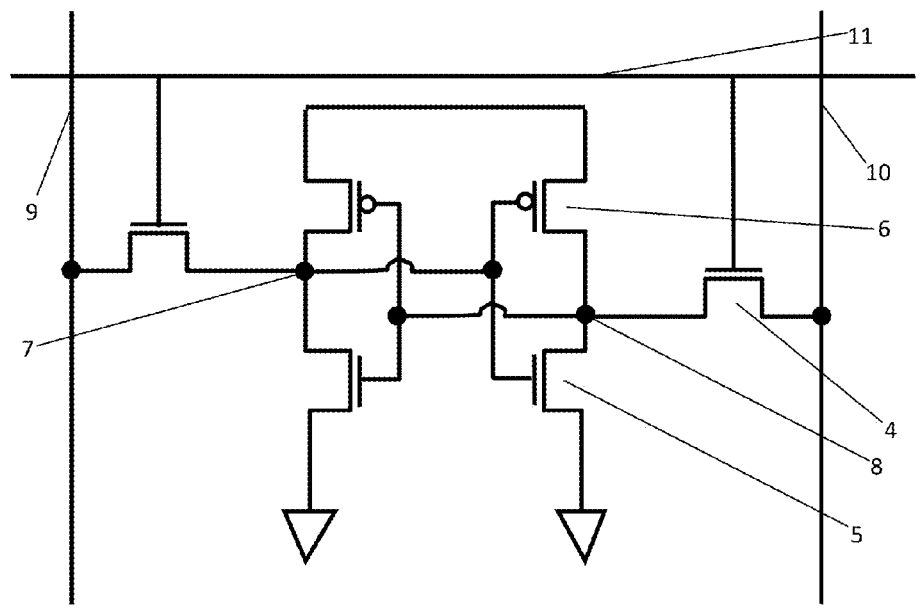
FIG. 2 is a circuit diagram of the SRAM cell.

To be specific, referring to FIG. 2 again, in the example of writing a high potential to the node 7 and a low potential to the node 8 in a SRAM cell, before the write operation, the bit line 9 will be pre-charged to a high potential, and the bit line 10 will be pre-charged to a low potential. At the beginning of the write operation, the word line 11 is turned on. The Pull Up MOS 6 is turned on while the Pull Down MOS 5 is turned off in the initial state since the initial data stored in the node 7 is in a low potential. Therefore, the potential of the node 8 will changes to an intermediate potential instead of "1" as the Pull Up MOS 6 and the Pass Gate 4 are both turned on, wherein the intermediate potential is determined by the equivalent resistance of the Pass Gate 4 and the Pull Up MOS 6. In the embodiment, the Pull Up MOS region 3 of the SRAM cell in the polysilicon layer is not pre-implanted, which reduces the doping concentration of polysilicon gate and increases the equivalent resistance of the Pull Up MOS 6. Consequently, the intermediate potential of the node 8 can be reduced and the write margin of the SRAM cell can be improved. In practice, the method for improving the write margins of the SRAM cells of the present invention can be applied in the manufacturing of 45 nm SRAM cells.

In addition, in another preferred embodiment, a method for manufacturing SRAM cells with enhanced write margins is also provided. As shown in FIG. 3, first, a polysilicon layer is deposited, in which SRAM NMOSFETs regions and SRAM PMOSFETs regions are defined. Wherein, the SRAM PMOSFETs regions are the Pull Up MOS regions 3, the SRAM NMOSFETs regions are the Pass Gate regions 1 and the Pull Down MOS regions 2. Then the fifth-group elements are pre-implanted to the SRAM NMOSFETs regions as well as the other NMOSFETs regions of the polysilicon layer except to the SRAM NMOSFETs regions; and the third-group elements are pre-implanted to the other PMOSFETs regions of the poysilicon layer excluding the SRAM PMOSFETs regions by using a pre-implantation photo mask covering the SRAM PMOSFETs regions. In an embodiment, the pre-implantation photo mask is formed through the logic operation and comprises a first mask area 11 covering the Pass Gate regions 1, a second mask area 21 covering the Pull Down MOSFET regions 2, and a third mask area 31 covering the Pull Up MOSFET regions 3. Then the polysilicon layer is etched to form the polysilicon gates of the Pass Gate and the Pull Down MOS, which are NMOSFETs, and the polysilicon gates of the Pull Up MOS, which is a PMOSFET.

In summary, according to the method for improving the write margins of the SRAM cells of the present invention, the process of pre-implanting the Pull Up MOS regions of the SRAM cells is removed without any additional process by utilizing a pre-implantation photo mask covering the Pull Up MOS regions, thus the doping concentration of the polysilicon gates of the Pull Up MOS is reduced, and the parasitic resistance and the depletion effects of polysilicon gate increase, which results in the increase of the threshold voltage of the Pull Up MOS and the decrease of the open current, thereby reducing the potential of the node 8 and improving the write margins of the SRAM cells.

The invention claimed is:

1. A method for improving the write margins of the SRAM cells comprising:

before etching a polysilicon layer to form the polysilicon gates, performing a pre-implantation process to the polysilicon layer;

wherein the polysilicon layer defines SRAM NMOSFETs regions, non-SRAM NMOSFETs regions, SRAM PMOSFETs regions and non-SRAM PMOSFETs regions; the pre-implantation process comprises pre-implanting the fifth-group elements to the SRAM NMOSFETs regions as well as the non-SRAM NMOSFETs regions in the polysilicon layer, and pre-implanting the third-group elements to the non-SRAM PMOSFETs regions in the polysilicon layer;

wherein the process of pre-implanting the third-group elements comprises forming a pre-implantation photo mask capable of covering the SRAM PMOSFETs regions and using the pre-implantation photo mask to pre-implanting the third-group elements.

2. The method for improving the write margins of the SRAM cells according to claim 1, wherein the pre-implantation photo mask capable of covering the SRAM PMOSFETs regions is formed through the logic operation.

3. The method for improving the write margins of the SRAM cells according to claim 1, wherein the SRAM NMOSFETs regions are Pass Gate regions and Pull Down MOS regions; the SRAM PMOSFETs regions are Pull Up MOS regions.

4. The method for improving the write margins of the SRAM cells according to claim 3, wherein the pre-implantation photo mask comprises: a first mask area covering the Pass Gate regions, a second mask area covering the Pull Down MOS regions, and a third mask area covering the Pull Up MOS regions.

5. The method for improving the write margins of the SRAM cells according to claim 1, wherein the SRAM cell is manufactured by using 45 nm technology.

6. A method for manufacturing SRAM cells comprising:
depositing a polysilicon layer in which SRAM NMOSFETs regions, non-SRAM NMOSFETs regions, SRAM PMOSFETs regions and non-SRAM PMOSFETs regions are defined;

Pre-implanting the fifth-group elements to the SRAM NMOSFETs regions as well as the non-SRAM NMOSFETs regions in the polysilicon layer;

Pre-implanting the third-group elements to the non-SRAM PMOSFETs regions in the polysilicon layer by using a pre-implantation photo mask covering the SRAM PMOSFETs regions.

7. The method for manufacturing the SRAM cells according to claim 6, wherein the pre-implantation photo mask is formed through the logic operation.

8. The method for manufacturing the SRAM cells according to claim 6, wherein the SRAM NMOSFETs regions are Pass Gate regions and Pull Down MOS regions; the SRAM PMOSFETs regions are Pull Up MOS regions.

9. The method for manufacturing the SRAM cells according to claim 8, wherein the pre-implantation photo mask comprises: a first mask area covering the Pass Gate regions, a second mask area covering the Pull Down MOS regions, and a third mask area covering the Pull Up MOS regions.

10. The method for manufacturing the SRAM cells according to claim 6, wherein the SRAM cell is manufactured by using 45 nm technology.

* * * * *